United States Patent
Lee

(10) Patent No.: US 9,818,803 B2
(45) Date of Patent: Nov. 14, 2017

(54) PIXEL ARRANGEMENT STRUCTURE FOR ORGANIC LIGHT EMITTING DISPLAY DEVICE

(75) Inventor: Sang-Shin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 199 days.

(21) Appl. No.: 13/614,197

(22) Filed: Sep. 13, 2012

(65) Prior Publication Data

US 2013/0234917 A1 Sep. 12, 2013

(30) Foreign Application Priority Data

Mar. 6, 2012 (KR) .......................... 10-2012-0022967

(51) Int. Cl.
*G09G 3/32* (2016.01)
*H01L 27/32* (2006.01)

(52) U.S. Cl.
CPC ...... *H01L 27/3216* (2013.01); *H01L 27/3218* (2013.01)

(58) Field of Classification Search
USPC ..................................... 345/82, 419
See application file for complete search history.

(56) References Cited

U.S. PATENT DOCUMENTS

| 6,366,025 | B1 | 4/2002 | Yamada | |
| 6,867,549 | B2* | 3/2005 | Cok et al. | .................. 315/169.3 |
| 6,882,364 | B1 | 4/2005 | Inuiya et al. | |
| 7,274,383 | B1* | 9/2007 | Brown Elliot | ................ 345/694 |
| 8,026,669 | B2* | 9/2011 | Kawasaki et al. | ......... 315/169.3 |
| 8,330,352 | B2* | 12/2012 | Sung et al. | .................... 313/504 |
| 8,350,468 | B2* | 1/2013 | Ko et al. | ........................ 313/506 |
| 8,354,789 | B2* | 1/2013 | Kim | .................... H01L 27/3218 |
| | | | | 313/504 |
| 2002/0015110 | A1 | 2/2002 | Brown Elliott | |
| 2002/0070909 | A1 | 6/2002 | Asano et al. | |
| 2002/0113195 | A1* | 8/2002 | Osada | ........................ 250/208.1 |
| 2003/0128179 | A1* | 7/2003 | Credelle | .......... G02F 1/133514 |
| | | | | 345/88 |
| 2004/0108818 | A1 | 6/2004 | Cok et al. | |
| 2004/0183764 | A1 | 9/2004 | Kim et al. | |

(Continued)

FOREIGN PATENT DOCUMENTS

| GB | 2 437 110 A | 10/2007 |
| JP | 10-39791 | 2/1998 |

(Continued)

OTHER PUBLICATIONS

EPO Search Report dated Jul. 8, 2013, for corresponding European Patent application 13157562.3, (6 pages).

(Continued)

*Primary Examiner* — Kwang-Su Yang
(74) *Attorney, Agent, or Firm* — Lewis Roca Rothgerber Christie LLP

(57) ABSTRACT

A pixel arrangement structure of an OLED display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

21 Claims, 5 Drawing Sheets

(56) References Cited

U.S. PATENT DOCUMENTS

| | | |
|---|---|---|
| 2005/0001542 A1 | 1/2005 | Kiguchi |
| 2005/0162079 A1 | 7/2005 | Sakamoto |
| 2006/0152531 A1* | 7/2006 | Lin .................. G09G 3/3225 345/613 |
| 2008/0001525 A1 | 1/2008 | Chao et al. |
| 2008/0001527 A1 | 1/2008 | Koo et al. |
| 2008/0273793 A1 | 11/2008 | Oishi |
| 2008/0308819 A1 | 12/2008 | Louwsma et al. |
| 2009/0302331 A1* | 12/2009 | Smith et al. .................. 257/88 |
| 2010/0033084 A1 | 2/2010 | Ko et al. |
| 2010/0133994 A1* | 6/2010 | Song .................. H01L 27/3211 313/504 |
| 2010/0171440 A1* | 7/2010 | Satou et al. .................. 315/294 |
| 2011/0012820 A1* | 1/2011 | Kim et al. .................. 345/82 |
| 2011/0291550 A1 | 12/2011 | Kim et al. |
| 2012/0056531 A1 | 3/2012 | Park et al. |
| 2012/0086330 A1 | 4/2012 | Umeda et al. |
| 2012/0287605 A1* | 11/2012 | Chen .................. H01L 27/322 362/97.1 |
| 2012/0313844 A1 | 12/2012 | Im et al. |
| 2012/0319564 A1* | 12/2012 | Ghosh et al. .................. 313/500 |
| 2013/0037827 A1 | 2/2013 | Levermore et al. |
| 2013/0127689 A1* | 5/2013 | Gollier .................. G02F 1/133504 345/32 |
| 2015/0192834 A1 | 7/2015 | Morinaga et al. |

FOREIGN PATENT DOCUMENTS

| | | |
|---|---|---|
| JP | 2000-235891 | 8/2000 |
| JP | 2004-507773 | 3/2004 |
| JP | 2004-192813 | 7/2004 |
| JP | 2006-309182 | 11/2006 |
| JP | 2008-015521 | 1/2008 |
| JP | 2011-076760 | 4/2011 |
| KR | 10-0742370 B1 | 7/2007 |
| KR | 10-0807524 | 2/2008 |
| KR | 10-2008-0111130 | 12/2008 |
| KR | 10-2009-0017910 | 2/2009 |
| KR | 10-2011-0023996 | 3/2011 |
| KR | 10-2011-0106565 | 9/2011 |
| KR | 10-2011-0129531 | 12/2011 |
| KR | 10-2012-0022967 | 3/2012 |
| TW | I328207 | 8/2010 |
| WO | WO 2004/073356 A1 | 8/2004 |
| WO | WO 2005/067352 A1 | 7/2005 |

OTHER PUBLICATIONS

Korean Patent Abstracts, Publication No. 1020030031207A, dated Apr. 21, 2003 for corresponding Korean Patent 10-0807524 listed above.

EPO Search Report dated Jul. 9, 2014, for European Patent application 14155124.2, (8 pages).

*Korean Patent Abstracts for Korean Publication 1020070055908 dated May 31, 2007, to Korean Patent 10-0742370 dated Jul. 24, 2007, listed above.

EPO Search Report dated Dec. 20, 2013 for European Patent application 13178648.5, (9 pages).

U.S. Office action dated Aug. 29, 2014, for cross reference U.S. Appl. No. 14/059,356, (18 pages).

SIPO Office action dated Mar. 11, 2015, for corresponding Chinese Patent application 201310035429.X, (7 pages).

Taiwan Office action dated Mar. 30, 2015, for corresponding Taiwanese Patent application 102101000, (7 pages).

U.S. Office action dated Jun. 30, 2015, for cross reference U.S. Appl. No. 13/872,018, (22 pages).

U.S. Office action dated Feb. 29, 2016, for cross reference U.S. Appl. No. 13/872,018, (15 pages).

U.S. Office action dated Oct. 16, 2015, for cross reference U.S. Appl. No. 13/872,018, (16 pages).

KIPO Office action dated Jul. 11, 2016, with English translation, for corresponding Korean Patent application 10-2016-0047800, (11 pages).

U.S. Office Action dated Sep. 2, 2016 for U.S. Appl. No. 13/872,018 (15 sheets).

U.S. Office action dated Aug. 5, 2016, for related U.S. Appl. No. 15/090,591 (11 pages).

English Abstract of TW 2008-02221 A, also published as TW I328207, listed above.

TIPO Office Action dated Oct. 11, 2016, for corresponding Taiwanese Patent Application No. 102124953 (6 pages).

U.S. Office Action dated May 11, 2017, issued in cross-reference U.S. Appl. No. 13/872,018 (16 pages).

* cited by examiner

PIXEL ARRANGEMENT STRUCTURE FOR ORGANIC LIGHT EMITTING DISPLAY DEVICE

CROSS-REFERENCE TO RELATED PATENT APPLICATION

This application claims priority to and the benefit of Korean Patent Application No. 10-2012-0022967, filed in the Korean Intellectual Property Office on Mar. 6, 2012, the entire content of which is incorporated herein by reference.

BACKGROUND

1. Field

Aspects of embodiments of the present invention relate generally to a pixel arrangement structure of an organic light emitting diode (OLED) display.

2. Description of the Related Art

A display device is a device that displays an image. Recently, an OLED display has been drawing attention. The OLED display has a self-luminous characteristic. Because the OLED display does not need a separate light source, unlike a liquid crystal display, it can have a relatively smaller thickness and weight than liquid crystal displays. In addition, the OLED display exhibits high-quality characteristics such as low power consumption, high luminance, high response speed, etc.

In general, the OLED display includes a plurality of pixels for emitting light of different colors. The plurality of pixels emit light to display an image. Here, the pixel refers to a minimum unit for displaying the images. For instance, there may be a gate line, a data line, and a power line such as a driving power line to drive each pixel. In addition, there may be an insulation layer such as a pixel definition layer to define an area and a shape of each pixel. Further, each pixel may be positioned between its neighboring pixels.

An organic emission layer included in the pixel of an OLED display may be deposited and formed by using a mask such as a fine metal mask (FMM). When reducing a gap between the neighboring pixels to obtain a high aperture ratio of the pixel, deposition reliability may be deteriorated. On the other hand, when increasing the gap between the pixels to improve the deposition reliability, the aperture ratio of the pixel may be deteriorated.

The above information disclosed in this Background section is only for enhancement of understanding of the background of the invention. Therefore, it may contain information that does not form the prior art that is already known in this country to a person of ordinary skill in the art.

SUMMARY

Aspects of embodiments of the present invention relate generally to a pixel arrangement structure of an OLED display. More particularly, aspects relate to a pixel arrangement structure of an OLED display for displaying images by emitting light through a plurality of pixels. An exemplary embodiment of the present invention provides a pixel arrangement structure for an OLED display having an improved aperture ratio of a pixel while efficiently setting up a gap between the pixels.

According to an exemplary embodiment of the present invention, a pixel arrangement structure of an organic light emitting diode display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

The second pixel may include a pair of second pixels. The second pixels may be separated from each other by the first pixel.

The third pixel may include a pair of third pixels. The third pixels may be separated from each other by the first pixel.

The second pixels and the third pixels may enclose the first pixel in the virtual square.

The first pixel, the second pixels, and the third pixels may have polygonal shapes. The second pixels and the third pixels may have a larger area than the first pixel.

The first pixel may have a quadrilateral shape. The second pixels and the third pixels may have hexagonal or octagonal shapes.

The second pixels and the third pixels may have octagonal shapes.

The second pixels and the third pixels may have a same area. A distance between the first pixel and the second pixels, a distance between the first pixel and the third pixels, and a distance between the second pixels and the third pixels may be a same first length.

The first pixel may include a plurality of first pixels. The plurality of first pixels may have a same quadrilateral shape. A distance between neighboring ones of the plurality of first pixels may be a second length that is longer than the first length.

The second pixels may have a larger area than the third pixels. A distance between the second pixels and the third pixels may be a first length. A distance between the first pixel and the second pixels, and a distance between the first pixel and the third pixels may be a same second length.

The first pixel may include a plurality of first pixels. The plurality of first pixels may have a same quadrilateral shape. A distance between neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other. A distance between the neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other.

The second pixels may have a larger area than the third pixels.

The third pixels may have a larger area than the second pixels.

The first pixel, the second pixel, and the third pixel may be configured to emit different color lights.

The first pixel, the second pixel, and the third pixel may be configured to emit green light, blue light, and red light, respectively.

According to an exemplary embodiment of the present invention, the pixel arrangement structure of the OLED display improves the aperture ratio of the pixel while efficiently setting up the gap between the pixels.

DETAILED DESCRIPTION

Figure 1:
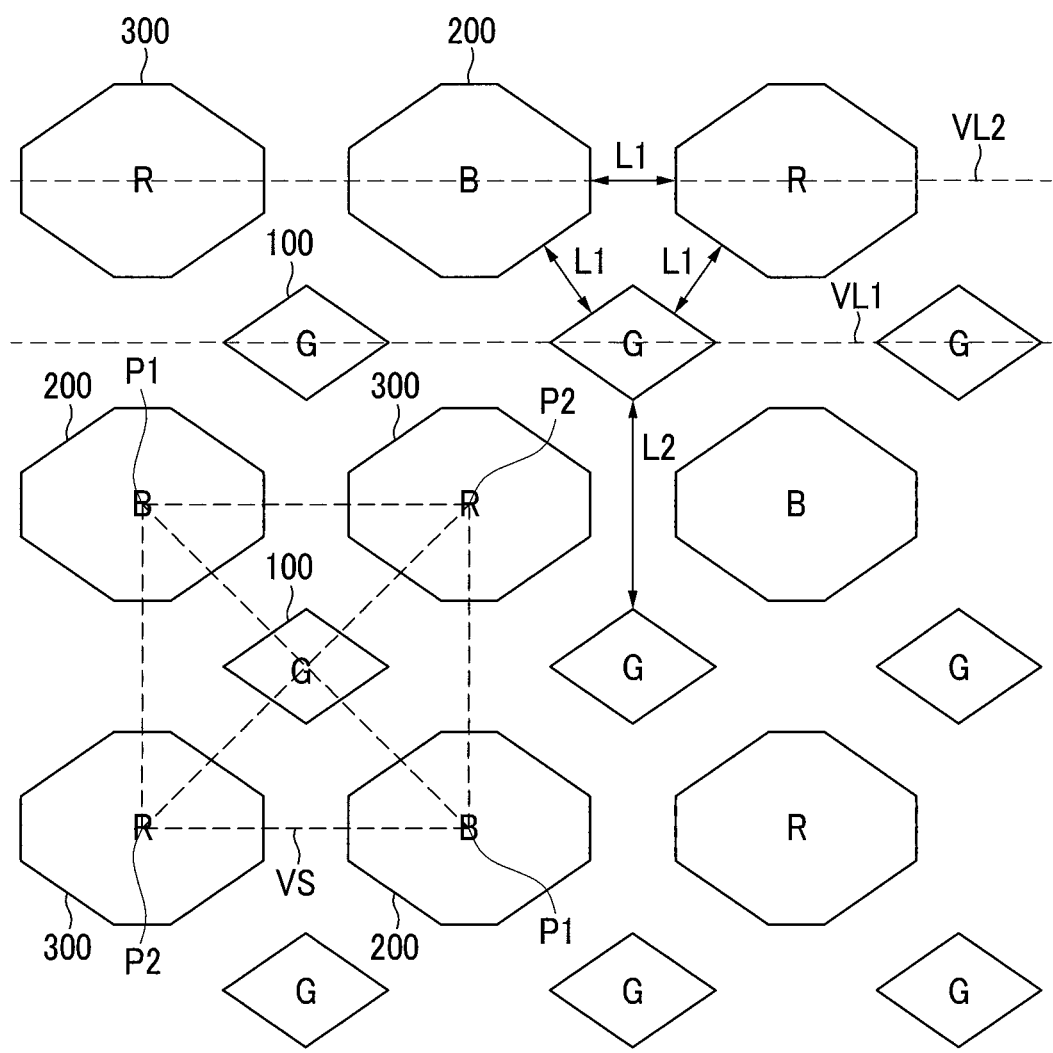
FIG. 1 is a view of a pixel arrangement structure of an OLED display according to a first exemplary embodiment.

Several exemplary embodiments according to the present invention are described hereinafter in detail with reference to the accompanying drawings to allow one of a person of ordinary skill in the art to practice the invention without undue experimentation. The present invention can be embodied in several different forms, and is not limited to exemplary embodiments that are described herein.

In order to clarify the description of embodiments of the present invention, parts that are not related to the embodiments may be omitted. In addition, the same elements or equivalents are referred to with the same reference numerals throughout the specification. For example, the same reference numerals are used for the elements having the same constructions throughout. Such elements are representatively described in a first exemplary embodiment, and in remaining exemplary embodiments, only different constructions from those of the first exemplary embodiment may be described.

Further, since sizes and thicknesses of constituent members shown in the accompanying drawings are arbitrarily given for better understanding and ease of description, the present invention is not limited to the illustrated sizes and thicknesses. In addition, unless explicitly described to the contrary, the word "comprise" and variations such as "comprises" or "comprising" will be understood to imply the inclusion of stated elements but not the exclusion of any other elements.

Nevertheless, even though each of the pixels are drawn as stereotypical polygonal shapes in the drawings, the present invention is not limited to this shape. That is, the shapes of the pixels may be modified to avoid interference with the other components of the OLED (e.g., wirings) within the spirit and scope of the appended claims.

A pixel arrangement structure (or pixel arrangement) of an OLED display according to a first exemplary embodiment will be described with reference to FIG. 1. FIG. 1 is a view schematically showing a portion of pixels forming an OLED display.

As shown in FIG. 1, the pixel arrangement structure of the OLED display includes a plurality of first pixels 100, a plurality of second pixels 200, and a plurality of third pixels 300. Here, the pixel refers to a minimum unit for displaying an image (for example, the minimum addressable unit of the display).

Further, among the first pixels 100, the second pixels 200, and the third pixels 300, power lines for driving each of the pixels, such as a gate line, a data line, a driving power line, and the like, may be located. In addition, an insulation layer, such as a pixel defining layer, for defining each of the pixels may be disposed. Finally, an OLED including an anode, an organic emission layer, and a cathode to correspond to each of the first pixels 100, the second pixels 200, and the third pixels 300 may be disposed. These configurations are technologies known in the art and further description thereof is omitted for ease of description. A shape of each of the pixels may be defined by the power lines, the pixel defining layer, the anode, or the like, but is not limited thereto.

In the pixel arrangement of FIG. 1, each of the first pixels 100 has a smaller area than neighboring second pixels 200 and third pixels 300, and has a quadrilateral (i.e., four-sided) shape among polygon shapes. For example, in the pixel arrangement of FIG. 1, each of the first pixels 100 has the same quadrilateral shape (e.g., a square or rhombus). The first pixels 100 are spaced apart from each other and arranged in rows, such as along a first virtual straight line VL1. The first pixels 100 emit green light, and may include an organic emission layer for emitting green light.

The second pixels 200 are arranged diagonally with respect to the first pixels 100, such as at first vertices P1 along one diagonal of a virtual square VS having one of the first pixels 100 as a center point (or center) of the virtual square VS. In a similar fashion, the third pixels 300 are arranged diagonally with respect to the first pixels 100, such as at second vertices P2 along the other diagonal of the virtual square VS.

In the virtual square VS, each of the second pixels 200 is separated from the first pixel 100, and is centered at one of the first vertices P1 of the virtual square VS. Each of the second pixels 200 has a larger area than the neighboring first pixel 100 and has an octagonal (i.e., eight-sided) shape. In FIG. 1, the second pixels 200 each have the same octagonal shape. In addition, the second pixels 200 are arranged diagonally and separated from each other by the first pixels 100. The second pixels 200 emit blue light, and may include an organic emission layer for emitting blue light.

In a similar fashion, in the virtual square VS, each of the third pixels 300 is separated from the first pixel 100 and the second pixels 200, and is centered at one of the second vertices P2 neighboring the first vertices P1 of the virtual square VS. Each of the third pixels 300 has a larger area than the neighboring first pixel 100 and the same area as each of the second pixels 200. Further, the third pixels have an octagonal shape (e.g., similar to or the same as the second pixels 200). In FIG. 1, the third pixels 300 each have the same octagonal shape. In addition, the third pixels 300 are arranged diagonally and separated from each other by the first pixels 100. The third pixels 300 emit red light, and may include an organic emission layer for emitting red light.

The third pixels 300 and the second pixels 200 are spaced apart from each other and alternately arranged in rows, such as along a second virtual straight line VL2. In a similar fashion, the third pixels 300 and the second pixels 200 are spaced apart from each other and alternately arranged in columns. Accordingly, in the virtual square VS, two of the second pixels 200 having their corresponding centers positioned at the first vertices P1 and two of the third pixels 300 having their corresponding centers positioned at the second vertices P2 to enclose a corresponding one of the first pixels 100 (e.g., in the virtual square VS).

As described above, the center of each of the second pixels 200 is positioned at one of the first vertices P1 of the virtual square VS. In addition, the center of the corresponding first pixel 100 is the center of the virtual square VS. Further, the center of each of the third pixels 300 is positioned at one of the second vertices P2. Moreover, the second pixels 200 and the third pixels 300 each have the same area.

As a non-limiting example, the distance (e.g., a shortest distance) between one of the first pixels 100 and an adjacent one of the second pixels 200 is a first length L1, the distance between one of the first pixels 100 and an adjacent one of the third pixels 300 is the same first length L1, and the distance between one of the second pixels 200 and an adjacent one of the third pixels 300 is the same first length L1, as shown in FIG. 1. In addition, the distance (e.g., a shortest distance) between the neighboring first pixels 100 is a second length L2 that is longer than the first length L1. It should be noted that L1, L2, L3, . . . may be used throughout to represent shortest distances between corresponding pixels.

Therefore, the gap of the first length L1 is formed between adjacent pairs of the first pixels 100 and the second pixels 200, between adjacent pairs of the first pixels 100 and the third pixels 300, and between adjacent pairs of the second pixels 200 and the third pixels 300. In addition, the gap of the second length L2 that is longer than the first length L1 is formed between the neighboring ones of the first pixels 100. This results in improved deposition reliability when using a fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, a manufacturing time and manufacturing cost of the entire OLED display may be reduced and the display quality of the image of the OLED display may be improved.

As described above, in the pixel arrangement structure of the OLED display of FIG. 1, the first pixels 100, the second pixels 200, and the third pixels 300 have polygonal shapes (e.g., the first pixels have a quadrilateral shape and the second pixels 200 and the third pixels 300 have an octagonal shape). In addition, it is worth considering that the deposition process of the organic emission layer is one of the unique manufacturing characteristics of the OLED display. Accordingly, to improve the deposition reliability of the organic emission layer in the deposition process using the fine metal mask and to improve the aperture ratio of the first pixels 100, the second pixels 200, and the third pixels 300, the center of each of the first pixels 100 is positioned at the center of a virtual square VS formed by a first pair of diagonal vertices P1 and a second pair of diagonal vertices P2. In the virtual square VS, the centers of a pair of the second pixels 200 are positioned at the first vertices P1, and the centers of a pair of the third pixels 300 are positioned at the second vertices P2.

In addition, in the pixel arrangement structure of the OLED display of FIG. 1, the first pixels 100, the second pixels 200, and the third pixels 300 respectively emit green, blue, and red light. However, in pixel arrangement structures of other OLED displays, the first pixels 100, the second pixels 200, and the third pixels 300 may emit light of different colors. For example, at least one of the second pixels 200 or the third pixels may emit white light.

Next, a pixel arrangement structure of an OLED display according to a second exemplary embodiment will be described with reference to FIG. 2. Parts that are different from the exemplary embodiment of FIG. 1 will be described, while the description of parts that are equivalent to the first exemplary embodiment may be omitted. For better comprehension and ease of description, constituent elements of the second exemplary embodiment that are the same as or similar to those of the first embodiment of FIG. 1 will have the same reference numerals.

Figure 2:
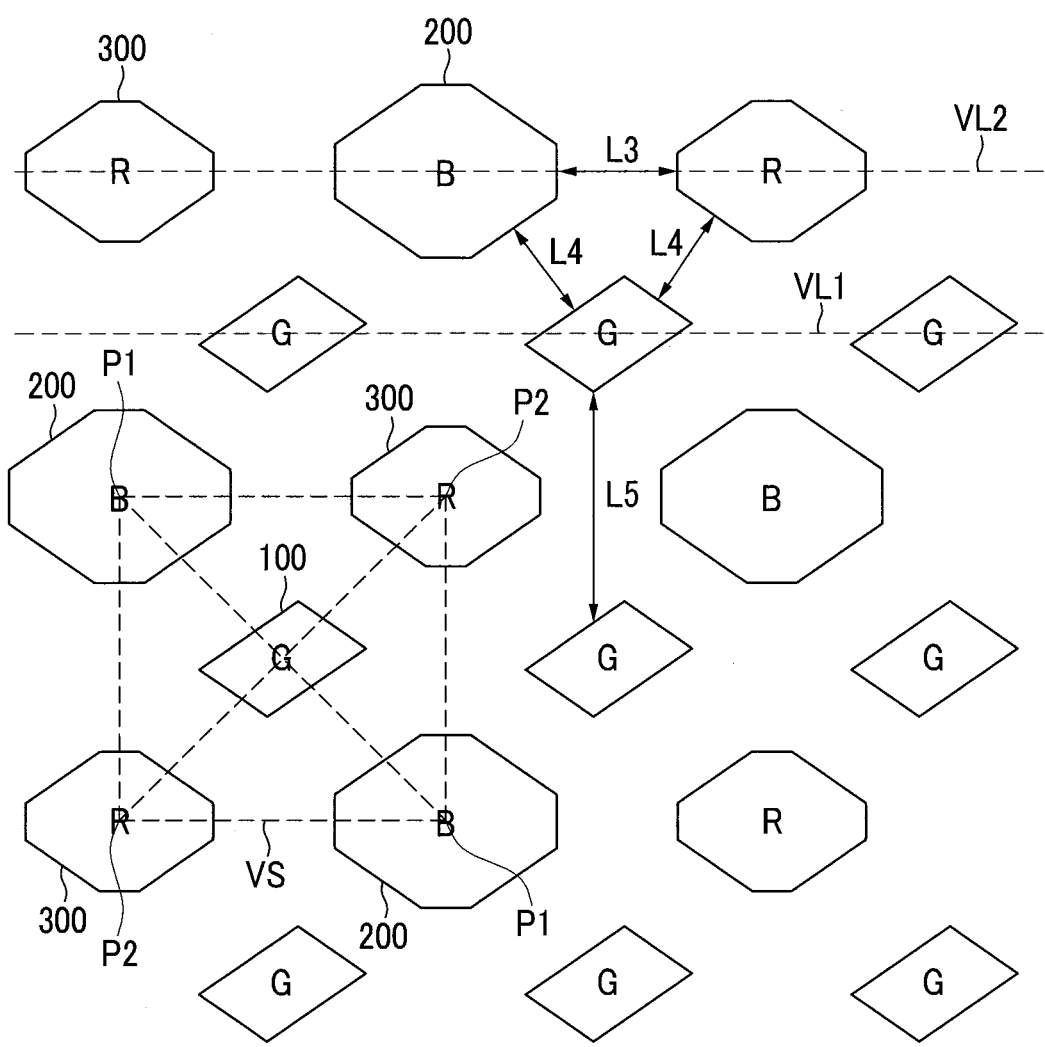
FIG. 2 is a view of a pixel arrangement structure of an OLED display according to a second exemplary embodiment.

As shown in FIG. 2, the pixel arrangement structure of the OLED display includes a plurality of first pixels 100, a plurality of second pixels 200, and a plurality of third pixels 300. The plurality of first pixels 100 have the same quadrilateral shape (e.g., a parallelogram). In addition, the second pixels 200 have a larger area than the third pixels 300. The second pixels 200 and the third pixels 300 may have polygonal shapes, such as octagonal or hexagonal (i.e., six-sided).

In a similar fashion to that of FIG. 1, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 2, the second pixels 200 have a larger area than the third pixels 300.

As a non-limiting example, the distance between adjacent ones of the second pixels 200 and the third pixels 300 is a third length L3, while the distance between each of the first pixels 100 and adjacent ones of the second pixels 200 or the third pixels 300 have a same fourth length L4. In addition, the distance between neighboring ones of the first pixels 100 is a fifth length L5 that is longer than the third length L3 and the fourth length L4.

Accordingly, the gap of the fourth length L4 is formed between adjacent pairs of the first pixels 100 and the second pixels 200, and between adjacent pairs of the first pixels 100 and the third pixels 300. In addition, the gap of the third length L3 is formed between adjacent pairs of the second pixels 200 and the third pixels 300. Further, the gap of the fifth length L5 that is longer than the third length L3 and the fourth length L4 is formed between the neighboring ones of the first pixels 100. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 2, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display of FIG. 2 provides improved life span.

Next, a pixel arrangement structure of an OLED display according to a third exemplary embodiment will be described with reference to FIG. 3. Parts that are different from the above exemplary embodiments will be described, while the description of parts that are equivalent to the above exemplary embodiments may be omitted. For better comprehension and ease of description, constituent elements of the third exemplary embodiment that are the same as or similar to the above exemplary embodiments will have the same reference numerals.

Figure 3:
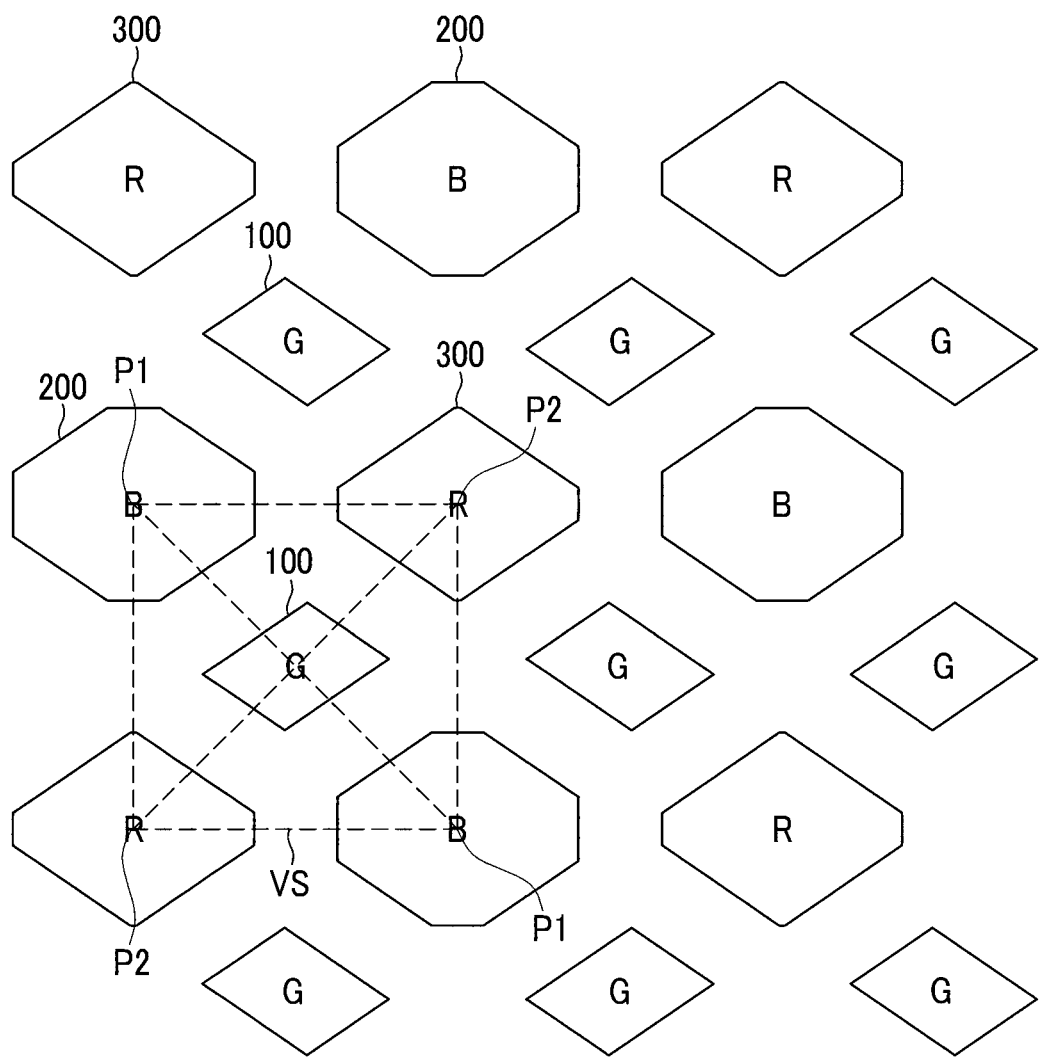
FIG. 3 is a view of a pixel arrangement structure of an OLED display according to a third exemplary embodiment.

As shown in FIG. 3, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the second pixels 200 have a larger area than the third pixels 300. The second pixels 200 and the third pixels may have polygonal shapes (e.g., hexagonal or octagonal).

In a similar fashion to that of FIGS. 1-2, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 3, the neighboring first pixels 100 have a quadrilateral shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by placing each of the first pixels 100 between a pair of the second pixels 200 and between a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 3, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display provides improved life span.

Next, a pixel arrangement structure of an OLED display according to a fourth exemplary embodiment will be described with reference to FIG. 4. Parts that are different from the above exemplary embodiments will be described, while the description of parts that are equivalent to the above exemplary embodiments may be omitted. For better comprehension and ease of description, constituent elements of the fourth exemplary embodiment that are the same as or similar to the above exemplary embodiments will have the same reference numerals.

Figure 4:
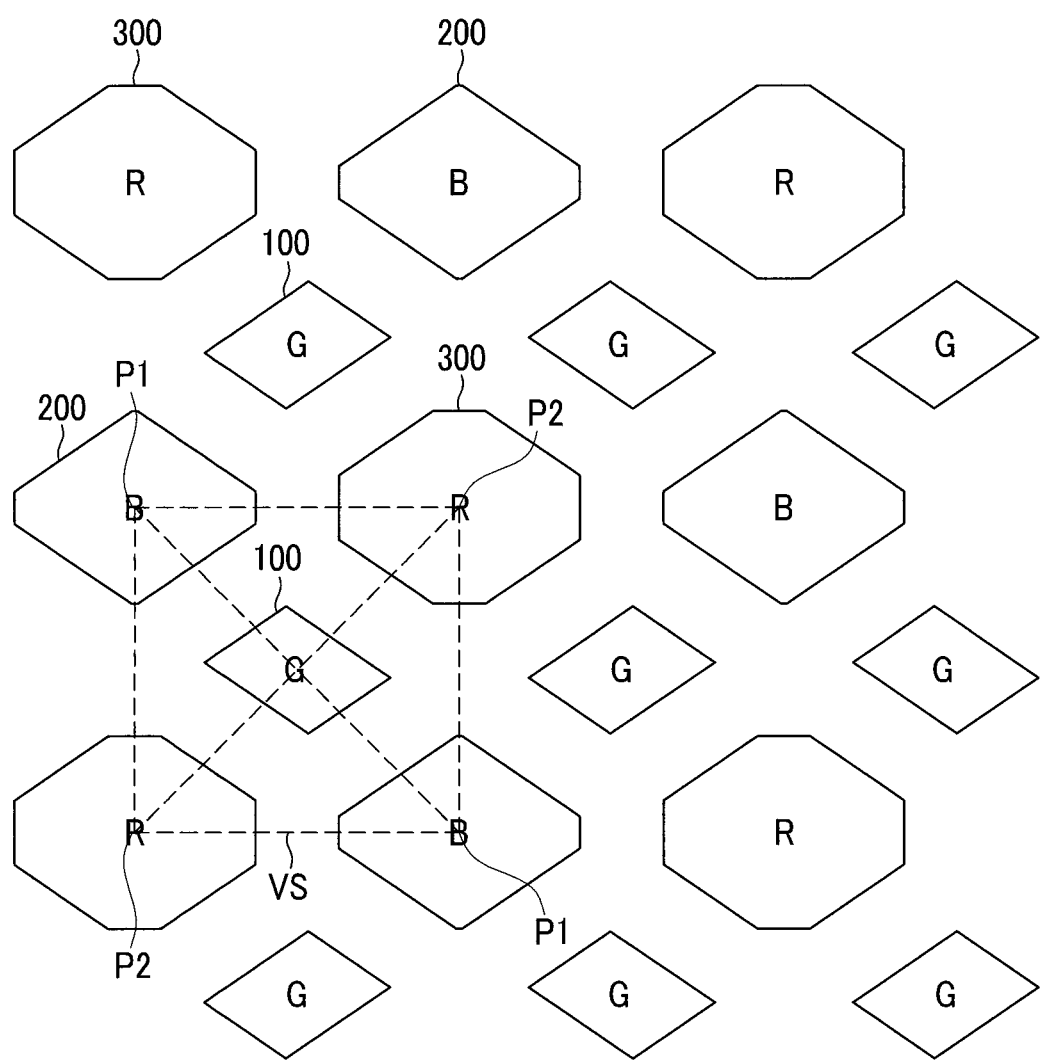
FIG. 4 is a view of a pixel arrangement structure of an OLED display according to a fourth exemplary embodiment.

As shown in FIG. 4, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the third pixels 300 have a larger area than the second pixels 200. The second pixels 200 and the third pixels may have polygonal shapes (e.g., hexagonal or octagonal).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 4, the neighboring first pixels 100 have a quadrilateral shape and are symmetrical to each other, while the third pixels 300 have a larger area than the second pixels 200. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Next, a pixel arrangement structure of an OLED display according to a fifth exemplary embodiment will be described with reference to FIG. 5. Parts that are different from the above exemplary embodiments will be described, while the description of parts that are equivalent to the above exemplary embodiments may be omitted. For better comprehension and ease of description, constituent elements of the fifth exemplary embodiment that are the same as or similar to the above exemplary embodiments will have the same reference numerals.

Figure 5:
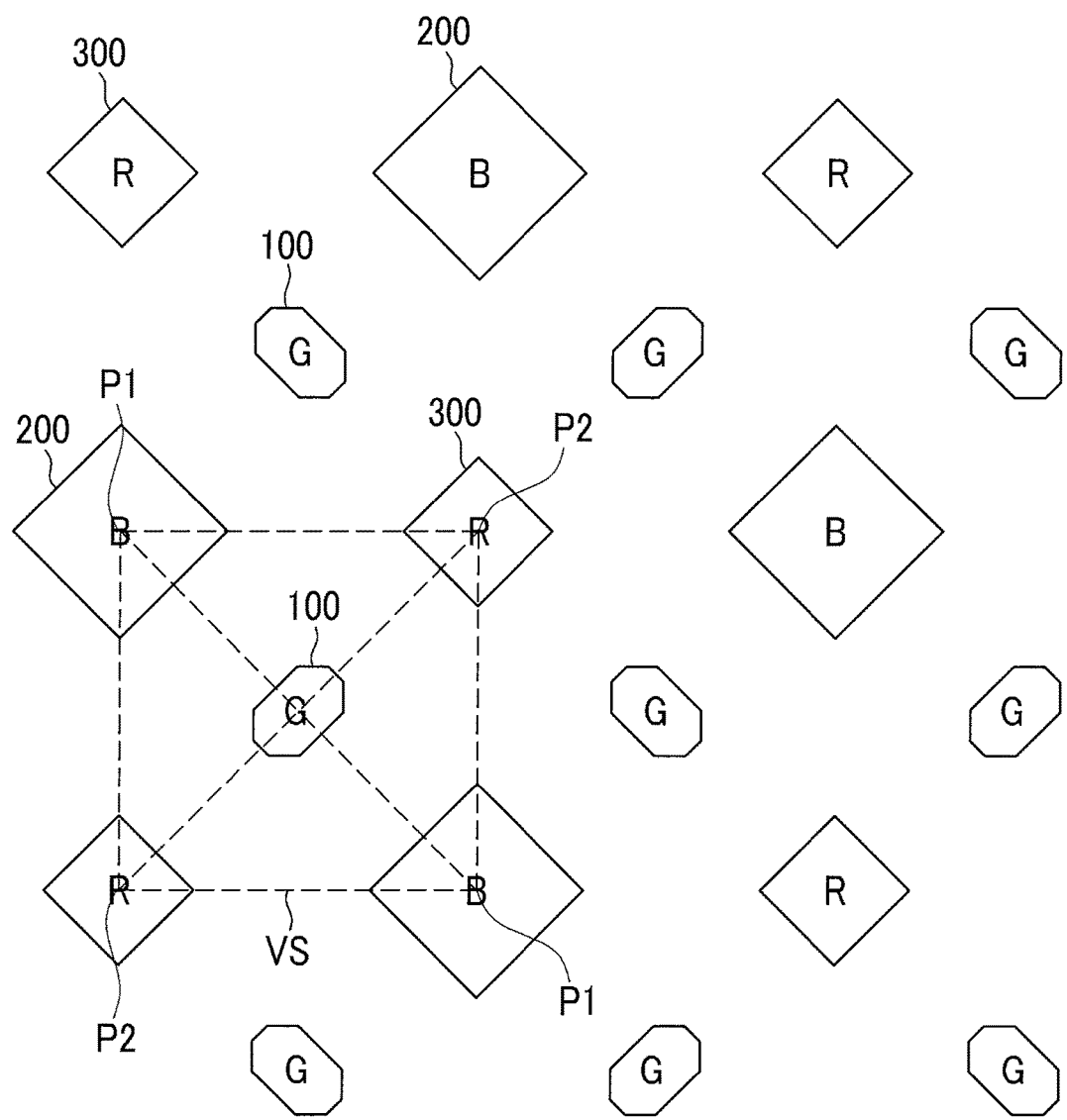
FIG. 5 is a view of a pixel arrangement structure of an OLED display according to a fifth exemplary embodiment.

As shown in FIG. 5, the pixel arrangement structure of the OLED display includes a plurality of first pixels 100, a plurality of second pixels 200, and a plurality of third pixels 300. Among the plurality of first pixels 100, the neighboring first pixels 100 have a octagonal shape and are symmetrical to each other. In addition, the second pixels 200 have a larger area than the third pixels 300. The second pixels 200 and the third pixels 300 may have quadrilateral shapes (e.g., rhombus).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 5, the neighboring first pixels 100 have a octagonal shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS first pixels 100, second pixels 200, third pixels 300

What is claimed is:

1. A pixel arrangement structure of an organic light emitting diode (OLED) display, comprising:
 a plurality of pixels for displaying an image on the OLED display and comprising:
  a first pixel having a center coinciding with a center of a virtual square;
  a second pixel separated from the first pixel and having a center at a first vertex of the virtual square;
  another first pixel on a line defined by the center of the virtual square and the first vertex, the first pixel, the second pixel, and the other first pixel being consecutive pixels on the line from among the plurality of pixels; and a third pixel separated from the first pixel and the second pixel, and having a center at a second vertex neighboring the first vertex of the virtual square, wherein the second pixel has a larger area than that of the third pixel, and wherein the first pixel is configured to emit green light.

2. The pixel arrangement structure of claim 1,
wherein the plurality of pixels further comprises another second pixel separated from the first pixel and having a center at a third vertex neighboring the second vertex of the virtual square, and wherein the second pixels are separated from each other by the first pixel.

3. The pixel arrangement structure of claim 2,
wherein the plurality of pixels further comprises another third pixel separated from the first pixel and having a center at a fourth vertex neighboring the third vertex of the virtual square, and wherein the third pixels are separated from each other by the first pixel.

4. The pixel arrangement structure of claim 3, wherein the second pixels and the third pixels enclose the first pixel in the virtual square.

5. The pixel arrangement structure of claim 4, wherein the first pixel, the second pixels, and the third pixels have polygonal shapes, and each of the second pixels and each of the third pixels has a larger area than the first pixel.

6. The pixel arrangement structure of claim 5, wherein the first pixel has a quadrilateral shape, and the second pixels and the third pixels have hexagonal or octagonal shapes.

7. The pixel arrangement structure of claim 6, wherein the second pixels and the third pixels have octagonal shapes.

8. The pixel arrangement structure of claim 7, wherein a shortest distance between the first pixel and corresponding ones of the second pixels, a shortest distance between the first pixel and corresponding ones of the third pixels, and a shortest distance between each of the second pixels and corresponding ones of the third pixels are a same first length.

9. The pixel arrangement structure of claim 8, wherein the first pixel comprises a plurality of first pixels, the plurality of first pixels have a same quadrilateral shape, and a shortest distance between neighboring pixels of the plurality of first pixels is a second length that is longer than the first length.

10. The pixel arrangement structure of claim 6, wherein each of the second pixels has a larger area than each of the third pixels, a shortest distance between each of the second pixels and corresponding ones of the third pixels is a same first length, and a shortest distance between the first pixel and corresponding ones of the second pixels, and a shortest distance between the first pixel and corresponding ones of the third pixels are a same second length.

11. The pixel arrangement structure of claim 10, wherein the first pixel comprises a plurality of first pixels, the plurality of first pixels have a same quadrilateral shape, and a shortest distance between neighboring pixels of the plurality of first pixels is a third length that is longer than the first length and the second length.

12. The pixel arrangement structure of claim 10, wherein the first pixel comprises a plurality of first pixels, neighboring pixels of the plurality of first pixels have quadrilateral shapes that are symmetrical to each other, and a shortest distance between the neighboring pixels of the plurality of first pixels is a third length that is longer than the first length and the second length.

13. The pixel arrangement structure of claim 6, wherein the first pixel comprises a plurality of first pixels, and neighboring pixels of the plurality of first pixels have quadrilateral shapes that are symmetrical to each other.

14. The pixel arrangement structure of claim 13, wherein each of the second pixels has a larger area than each of the third pixels.

15. The pixel arrangement structure of claim 5, wherein the first pixel has an octagonal shape, and the second pixels and the third pixels have quadrilateral shapes.

16. The pixel arrangement structure of claim 15, wherein each of the second pixels has a larger area than each of the third pixels, a shortest distance between each of the second pixels and each of the third pixels is a same first length, and a shortest distance between the first pixel and each of the second pixels, and a shortest distance between the first pixel and each of the third pixels are a same second length.

17. The pixel arrangement structure of claim 16, wherein the first pixel comprises a plurality of first pixels, and neighboring pixels of the plurality of first pixels have octagonal shapes that are symmetrical to each other.

18. The pixel arrangement structure of claim 17, wherein a shortest distance between the neighboring pixels of the plurality of first pixels is a third length that is longer than the first length and the second length.

19. The pixel arrangement structure of claim 1, wherein the first pixel, the second pixel, and the third pixel are configured to emit different color lights.

20. The pixel arrangement structure of claim 19, wherein the second pixel and the third pixel are configured to emit blue light and red light, respectively.

21. The pixel arrangement structure of claim 1, wherein the second pixel has a larger area than that of the first pixel.

* * * * *